United States Patent [19]

Nichols et al.

[11] Patent Number: 5,730,575
[45] Date of Patent: Mar. 24, 1998

[54] CONVERTIBLE WAFER TRANSFER MACHINE

[75] Inventors: Ernest C. Nichols, Boise; Leo L. Malmin, Jr., Nampa, both of Id.

[73] Assignee: Micron Technology, Inc., Boise, Id.

[21] Appl. No.: 631,381

[22] Filed: Apr. 11, 1996

[51] Int. Cl.$^6$ .................................................. B65G 65/34
[52] U.S. Cl. ..................... 414/404; 414/417; 414/937; 269/309; 269/903; 118/500
[58] Field of Search .................................. 414/217, 403, 414/249, 404, 416, 417, 935, 932; 254/939, 940, 133 R; 118/719, 500; 269/309, 903; 204/298.25

[56] References Cited

U.S. PATENT DOCUMENTS

| | | | |
|---|---|---|---|
| 5,246,218 | 9/1993 | Yap et al. | 414/937 X |
| 5,558,482 | 9/1996 | Hiroki et al. | 414/937 X |
| 5,566,840 | 10/1996 | Waldner et al. | 269/903 X |

FOREIGN PATENT DOCUMENTS

| | | | |
|---|---|---|---|
| 144022 | 8/1983 | Japan | 414/417 |

OTHER PUBLICATIONS

1994–95, H–Square Corporation—"Horizontal Wafer Transfer Machines" (pp. 8–1 through 8–4).

*Primary Examiner*—Frank E. Werner
*Attorney, Agent, or Firm*—Ormiston Korfanta Dunbar & Holland

[57] ABSTRACT

A semiconductor wafer transfer machine for transferring first wafers having a first diameter from a first transferor carrier to a first receiver carrier and second wafers having a second diameter different from the first diameter from a second transferor carrier to a second receiver carrier. The wafer transfer machine includes a base plate with a longitudinal axis for placement on the base plate of the transferor carriers and the receiver carriers and a mechanism for transferring wafers contained in the first and second transferor carriers to the first and second receiver carriers, respectively. The wafer transfer machine also includes an adjustable positioner that comprises (1) a transferor positioning mechanism for aligning the first and second transferor carriers on the top surface of the base plate, (2) a first receiver positioning mechanism for aligning the first receiver carrier in a first position with respect to the first transferor carrier on the top surface of the base plate, and (3) a second receiver positioning mechanism for aligning the second receiver carrier in a second position with respect to the second transferor carrier on the top surface of the base plate.

15 Claims, 4 Drawing Sheets

CONVERTIBLE WAFER TRANSFER MACHINE

FIELD OF THE INVENTION

The invention relates generally to semiconductor manufacturing equipment and, more particularly, to wafer transfer machines.

BACKGROUND OF THE INVENTION

Generally, semiconductor devices are mass produced by forming many identical circuit patterns on a single silicon wafer which is thereafter cut into many identical dies or "chips." Semiconductor devices, also commonly referred to as integrated circuits, are typically constructed by successively depositing or "stacking" layers of various materials on the wafer. Each layer is patterned as necessary to form the desired circuit components. To ensure reliable and predictable operation of integrated circuits, the wafer and deposited materials must be free from contamination. Hence, many fabrication processes must be performed in an environment that is essentially free from contamination. For example, the contamination level requirement for Class 1 cleanliness in semiconductor wafer processing areas or "clean rooms" is less than one part (contaminates) per cubic foot. To achieve this high degree of cleanliness, special high volume ventilation systems are used to continuously filter the air. These systems represent a significant contribution to the overall cost of manufacturing semiconductor devices. Accordingly, substantial cost savings can be realized by minimizing the size of the clean rooms and by making the most efficient use of all available clean room space.

A number of different size wafers, ranging from 3 inches in diameter to 8 inches in diameter, are currently produced in the semiconductor industry. In addition, development efforts are underway to produce 10 and 12 inch diameter wafers. While it is economically desirable to have the capability to produce wafers of all sizes, each size wafer generally requires its own special processing equipment. The redundancy in equipment to process different size wafers increases equipment costs as well as the size of the clean room and the associated construction and maintenance costs. Cost and space savings could be realized if the same equipment could be used to process different size wafers.

During the manufacture of semiconductor devices, the wafers are subjected to a number of different processes and environmental conditions. Wafer carriers, sometimes also called cassettes or "boats," are used to house the wafers for bulk storing and transporting through the manufacturing processes. Wafer carriers are not typically suitable for exposure to all of the different environmental conditions encountered during processing. As a result, the wafers have to be transferred between boats at various times during the production of the semiconductor devices. Wafer transfer machines are used to perform this task. Wafer transfer machines generally consist of a base and a transfer arm. A first carrier containing wafers and a second empty carrier are placed in fixed opposing positions on the base. The transfer arm is operable to move the wafers from the first carrier to the second carrier. Conventional wafer transfer machines are capable of transferring only one size wafer. A different machine must be acquired and placed in the clean room for each different size wafer and associated wafer carriers.

SUMMARY OF THE INVENTION

The present invention is directed to a wafer transfer machine that is capable of transferring different size wafers between their respective wafer carriers. It is one object of the invention to provide a readily convertible wafer transfer machine that can be used to perform wafer transfer operations for different size wafers. It is another object to reduce the number of machines necessary to support the processing of different size wafers, particularly in a clean room environment. It is a further object of the invention to reduce the equipment and associated clean room costs for the manufacture of semiconductor devices.

According to the present invention, these and other objects and advantages are achieved by a wafer transfer machine that includes (1) a base upon which wafer carriers are supported during transfer operations, the base having a first portion upon which transferor carriers are supported and a second portion upon which receiver carriers are supported, (2) a transfer arm operatively coupled to the base, the transfer arm is moveable along a longitudinal axis over at least the first portion of the base, (3) a first axial positioner disposed on the first portion of the base for positioning a transferor carrier on the base, and (4) a second axial positioner disposed on the second portion of the base for positioning a receiver carrier on the base, the second axial positioner moveable between a first position closer to the transfer arm for positioning a smaller receiver carrier and second positioned farther from the transfer arm for positioning a larger receiver carrier. In an alternative embodiment of the invention, second and third axial positioners are used in place of the moveable second axial positioner described above. A second axial positioner is used to position a smaller receiver carrier and a third axial positioner located farther from the transfer arm than is the second axial positioner is used to position a larger receiver carrier.

The axial positioners may be used in combination with a pair of transverse positioners attached opposite one another on the base along a line perpendicular to the longitudinal axis. Each transverse positioner has a first upstanding portion adjacent to the first portion of the base to engage a transferor carrier and a second upstanding portion adjacent to the second portion of the base to engage a receiver carrier. Preferably, the transverse positioners are moveable between a first position for positioning smaller carriers and a second position for positioning larger carriers.

In another embodiment of the invention, a plurality of different sized transfer plates are attached to the transfer arm. One of the transfer plates defines a wafer contact surface for smaller diameter wafers. A second transfer plate defines a wafer contact surface for larger diameter wafers. In this way, the contact surface of the transfer arm can accommodate smaller diameter wafers in correspondingly smaller wafer carriers and the larger diameter wafers in correspondingly larger wafer carriers.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
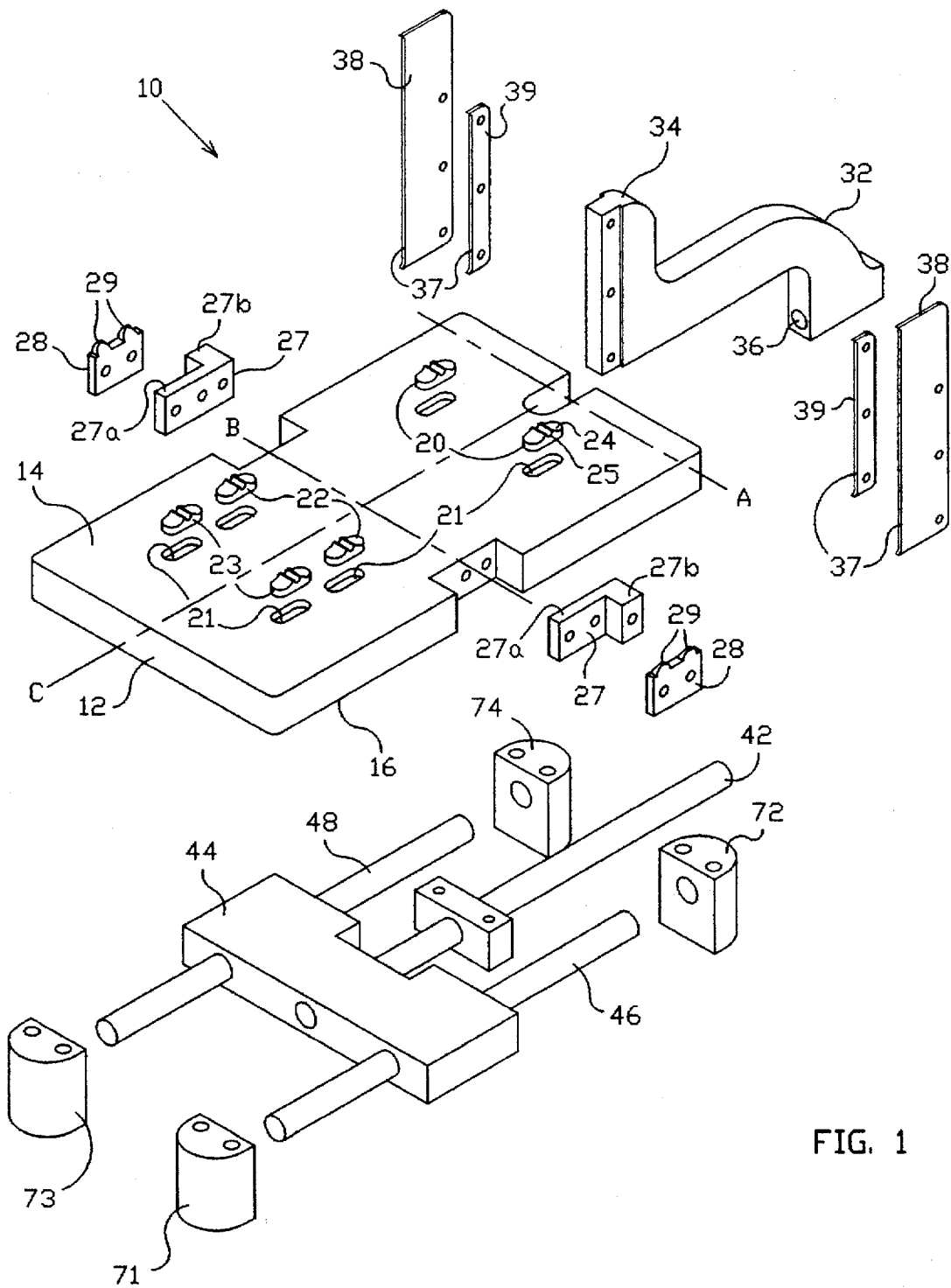
FIG. 1 is an exploded perspective view of a preferred embodiment of the convertible slide transfer machine.

The structure and operation of the wafer transfer machine of the present invention will be described generally with reference to FIGS. 1–4 to illustrate the presently preferred embodiments of the invention. The description of the preferred embodiments is not intended to limit the invention as set forth in the claims appended hereto. Referring first to FIGS. 1 and 4, a transferor carrier 50 containing semiconductor wafers (not shown) and a receiver carrier 60 are positioned on base plate 12 of wafer transfer machine 10. The wafers are transferred from transferor carrier 50 to receiver carrier 60 via a translatable transfer arm 32. Transfer arm 32 has a transfer end 34 and a translation end 36. The translation of the transfer arm 32 is by means of a slide 42. One end of slide 42 is attached to the translation end 36 of transfer arm 32. The other end of slide 42 is attached to slide holder 44. Slide holder 44 is slidably attached to guide members 46 and 48. Guide members 46 and 48 are mounted parallel to longitudinal axis C between two pairs of legs 71, 72 and 73, 74. Legs 71–74 are mounted to the second (bottom) surface 16 of base plate 12. Preferably, legs 71–74 are positioned on base plate 12 to block the movement of slide holder 44 and thereby limit the range of motion of transfer arm 32 to the distance between lines A and B along longitudinal axis C.

Figure 2:
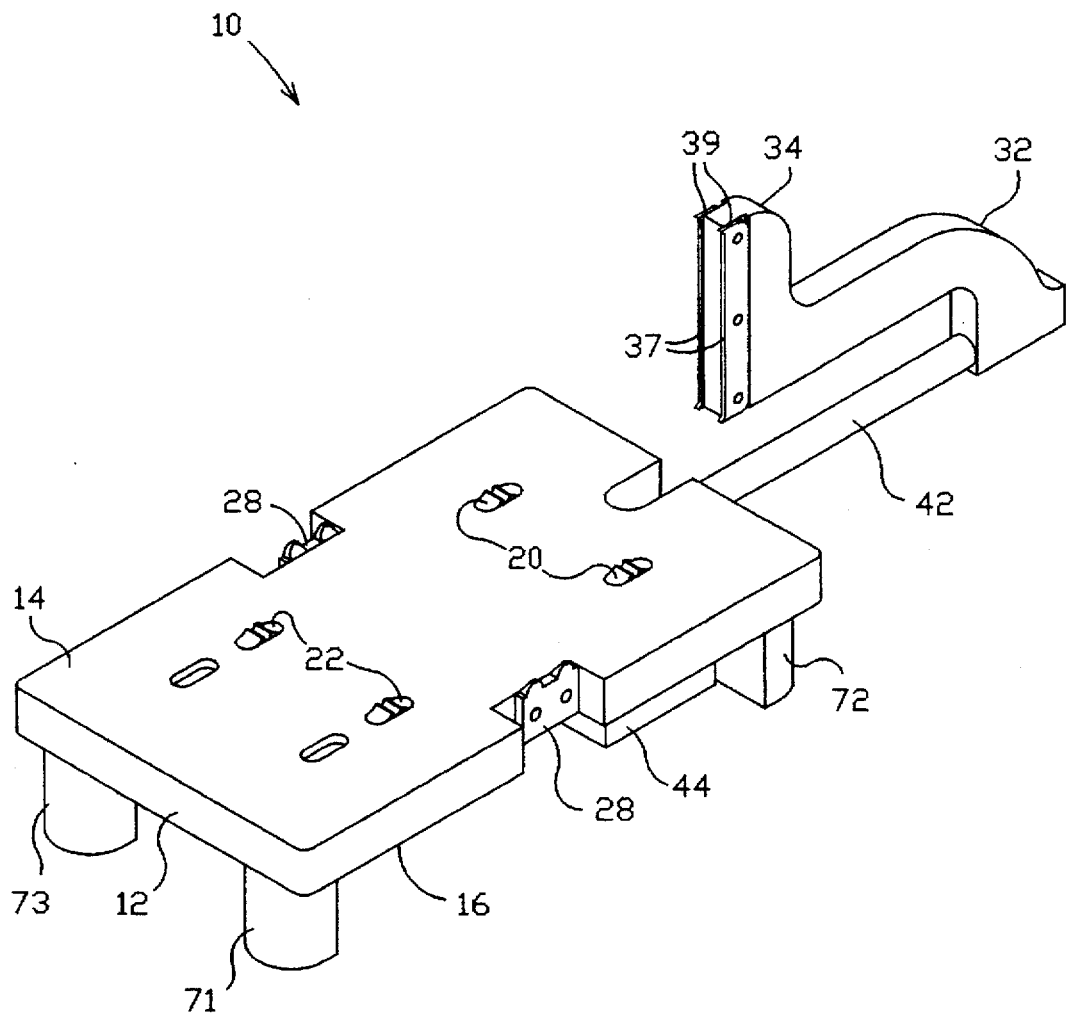
FIG. 2 is a perspective view of the convertible slide transfer machine of FIG. 1 adapted for transferring smaller diameter wafers, such as a six inch wafer.
Figure 3:
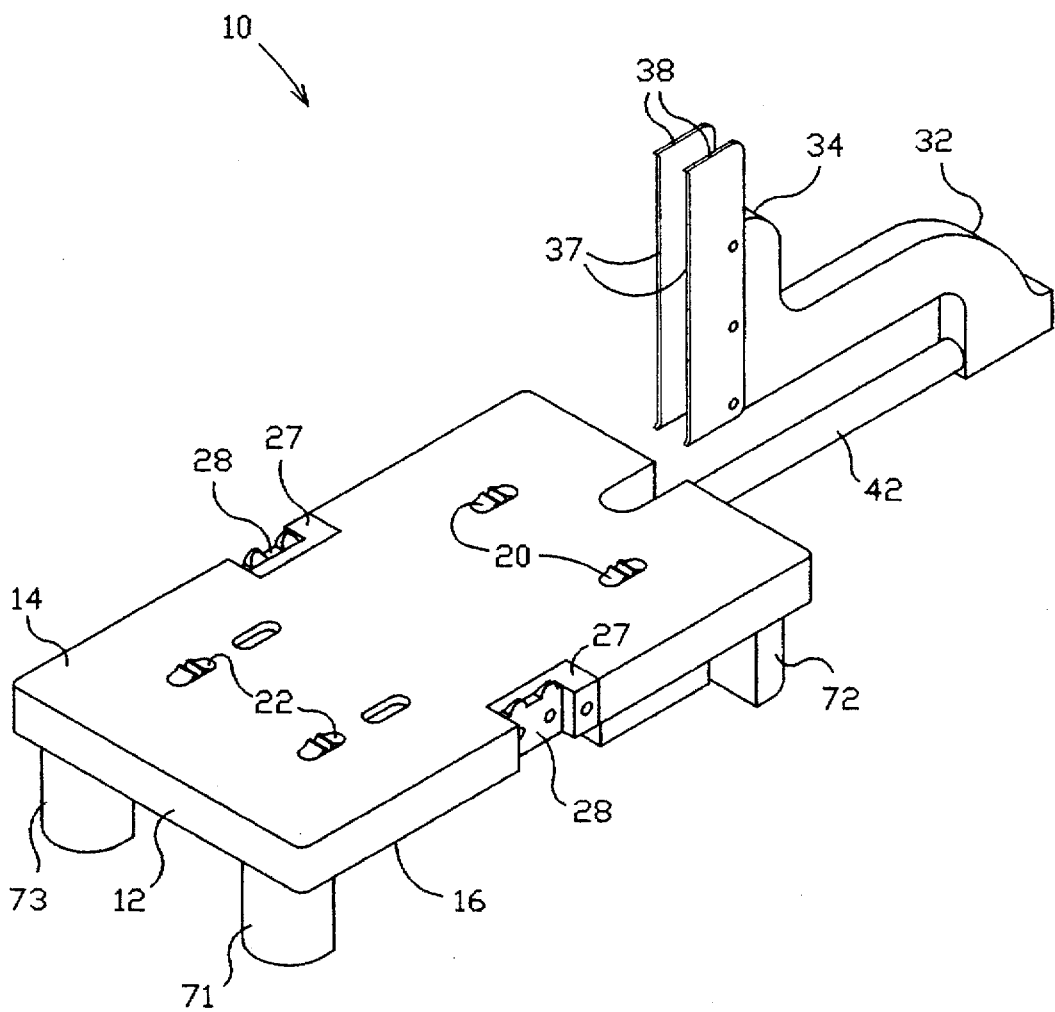
FIG. 3 is a perspective view of the convertible slide transfer machine of FIG. 1 adapted for transferring larger diameter wafers, such as an eight inch wafer.
Figure 4:
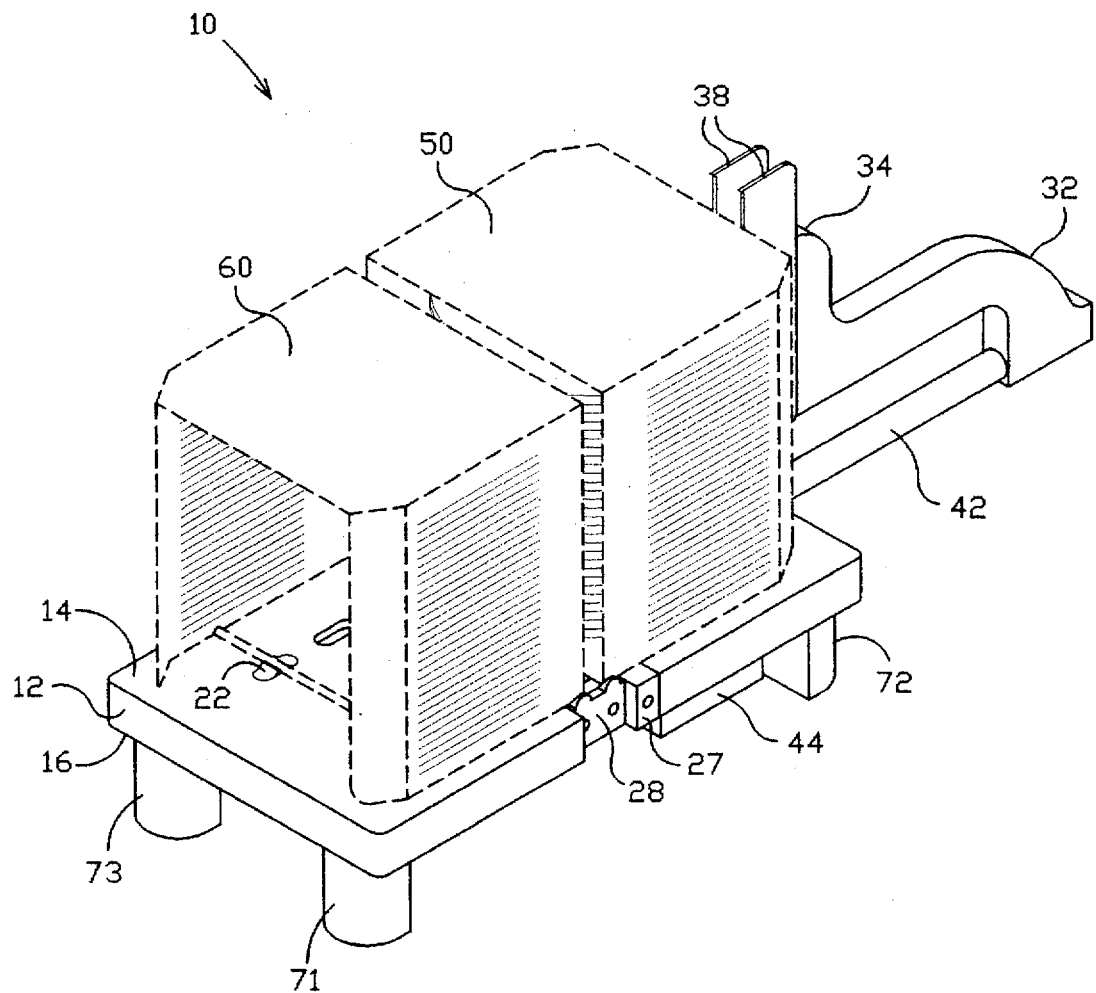
FIG. 4 is a perspective view of the convertible slide transfer machine of FIG. 3 with the transferor and receiver wafer carriers in place on the machine.

Reference will now be made to FIGS. 1–4. FIG. 1 shows all components of the convertible wafer transfer machine 10. FIG. 2 shows the convertible wafer transfer machine 10 in the configuration adapted for use in the transfer of first/smaller diameter wafers from a corresponding size first transferor carrier to a first receiver carrier. FIGS. 3 and 4 show the convertible wafer transfer machine 10 in the configuration adapted for use in the transfer of second/larger diameter wafers from a corresponding size second transferor carrier to a second receiver carrier. Different size transferor carriers 50 and receiver carriers 60 may be positioned on first/top surface 14 of base plate 12 along longitudinal axis C. The carriers 50, 60 are aligned along axis C. That is, the centerline of carriers 50, 60 are in a common plane with axis C that is perpendicular to top surface 14 of base plate 12. The wafers are transferred along this common plane. Separate axial and transverse positioners are used to align transferor carrier 50 and receiver carrier 60. A first pair of axial positioners 20 are mounted on top surface 14 of base plate 12 adjacent to transfer arm 32. First axial positioners 20 position transferor carrier 50 along axis C. A second pair of axial positioners 22 are removably mounted in slots 21 on top surface 14 of base plate 12 away from transfer arm 32. Second axial positioners 22 position receiver carrier 60 along axis C. Axial positioners 20, 22 are designed for use with an "H" bar type wafer carrier, such as the Flouroware, Inc. A200-80 and A196-60 series wafer carriers, as shown in FIG. 4. Axial positioners 20, 22 have a raised portion 24 above top surface 14 of base plate 12. Raised portion 24 has a recessed carrier engagement portion 25 that is perpendicular to longitudinal axis C. Carriers 50, 60 are positioned in wafer transfer machine 10 so that the horizontal "H" bar 61 is seated in recessed portion 25, thus preventing the carriers from moving axially along axis C. An optional third pair of axial positioners 23 may be mounted on top surface 14 of base plate 12, as shown on FIG. 1, to eliminate the need to move the axial positioners to accommodate different size transferor carriers.

A pair of transverse positioners 28 are mounted in recesses 18 on the sides of base plate 12. Transverse positioners 28 each have upstanding portions 29 that restrict the lateral movement of transferor carrier 50 and receiver carrier 60 when the carriers are installed in wafer transfer machine 10. Transverse positioners thus serve to position carriers 50, 60 laterally relative to longitudinal axis C. Preferably, transverse positioners 28 are positioned substantially at the interface of transferor and receiver carriers 50, 60 so that only one pair of transverse positioners is necessary to align both carriers. Transverse positioners 28 may be used in conjunction with extenders 27 to accommodate different size wafer carriers, as best seen by comparing FIG. 2 (for smaller diameter wafers—no extenders) and FIG. 3 (for larger diameter wafers—with extenders). Each extender 27 is an L shaped spacer. A first spacer portion 27a of extenders 27 extends the distance between transverse positioners 28 to accommodate the greater width of a larger wafer carriers. A second spacer portion 27b of extenders 27 moves transverse positioners 28 axially further away from the first pair of axial positioners 20 to accommodate the greater length of a larger wafer carriers. As will be readily apparent to those skilled in the art, various adaptations of the transverse positioners described herein are possible. For example, two pairs of transverse positioners, each pair being located along the transferor carrier and the receiver carrier, respectively, could be used instead of one pair. Further, a transverse positioner having an integral spacer could be used in place of the positioned extender combination to accommodate larger diameter wafers.

Transfer plates 38, 39 are provided to accommodate different size wafers and corresponding wafer carriers. Transfer plates 38, 39 are removably attached to transfer end 34 of transfer arm 32 to change the overall length of transfer arm 32 defining the wafer contact surface 37 appropriate for a particular size wafer. As shown in FIG. 2, transfer plate 39 is used for smaller diameter wafers. As shown in FIG. 3, transfer plate 38, which is taller and wider than transfer plate 38, is used for larger diameter wafers.

While there is shown and described the preferred embodiment of the invention, it is to be distinctly understood that this invention is not limited thereto but may be variously embodied to practice within the scope of the following claims.

What is claimed is:

1. A convertible wafer transfer machine for transferring different size wafers between their respective transferor and receiver wafer carriers, the machine comprising:

a. a base plate;

b. a first pair of axial positioners removably disposed on the base plate, each of the first pair of axial positioners having a recessed carrier engagement portion for engagement with transferor carriers;

c. a second pair of axial positioners removably disposed on the base plate, each of the second pair of axial positioners having a recessed carrier engagement portion for engagement with a smaller receiver carrier; and d. a third pair of axial positioners removably disposed on the base plate, each of the third pair of axial positioners having a recessed carrier engagement portion for engagement with a larger receiver carrier.

2. A convertible wafer transfer machine for transferring different size wafers between their respective transferor and receiver wafer carriers, the machine comprising:

a base plate;

b. a first pair of axial positioners removably disposed on the base plate, each of the first pair of axial positioners having a recessed carrier engagement portion for engagement with transferor carriers;

c. a second pair of axial positioners removably disposed on the base plate, each of the second pair of axial positioners having a recessed carrier engagement portion for engagement with a smaller receiver carrier;

d. a third pair of axial positioners removably disposed on the base plate, each of the third pair of axial positioners having a recessed carrier engagement portion for engagement with a larger receiver carrier; and e. a pair of transverse positioners attached to opposing sides of the base plate, the transverse positioners each having a recessed carrier engagement portion extending above the base plate for engagement with the carriers.

3. A wafer transfer machine according to claim 2, further comprising a pair of L shaped extenders, each extender removably mounted between one of the transverse positioners and the base plate, and each extender having a first spacer portion extending the distance between the transverse positioners to accommodate a greater width of larger carriers and a second spacer portion extending the distance between the transverse positioners and the first pair of axial positioners to accommodate a greater length of the larger carriers.

4. A convertible wafer transfer machine for transferring different size wafers between their respective transferor and receiver wafer carriers, the machine comprising:

a. a base plate;

b. a moveable transfer arm operatively coupled to the base plate;

c. a plurality of different size transfer plates removably attached to the transfer arm, a first one of the transfer plates defining a wafer contact surface for smaller diameter wafers and a second one of the transfer plates defining a wafer contact surface for larger diameter wafers;

d. a first axial positioner on the base plate, the first axial positioner configured to engage transferor carriers;

e. a second axial positioner on the base plate, the second axial positioner configured to engage a smaller receiver carrier; and f. a third axial positioner on the base plate, the third axial positioner configured to engage a larger receiver carrier.

5. A wafer transfer machine capable of transferring different size wafers between their respective transferor and receiver carriers, the machine comprising:

a. a base upon which wafer carriers are supported during transfer operations, the base having a first portion upon which transferor carriers are supported and a second portion upon which receiver carriers are supported;

b. a transfer arm operatively coupled to the base, the transfer arm moveable along a longitudinal axis at least over the first portion of the base;

c. a first axial positioner disposed on the first portion of the base for positioning a transferor carrier on the base; and d. a second axial positioner disposed on the second portion of the base for positioning a receiver carrier on the base, the second axial positioner moveable between a first position closer to the transfer arm for positioning a smaller receiver carrier and a second position farther from the transfer arm for positioning a larger receiver carrier.

6. A wafer transfer machine according to claim 5, wherein each axial positioner comprises a pair of positioners disposed opposite one another on either side of the longitudinal axis.

7. A wafer transfer machine according to claim 5, further comprising a pair of transverse positioners attached opposite one another on the base along a line perpendicular to the longitudinal axis, each transverse positioner having a first upstanding portion adjacent to the first portion of the base to engage a transfer or carrier and a second upstanding portion adjacent to the second portion of the base to engage a receiver carrier.

8. A wafer transfer machine according to claim 7, wherein each transverse positioner is moveable between a first position for positioning smaller carriers and a second position for positioning larger carriers.

9. A wafer transfer machine according to claim 8, further comprising a pair of L shaped extenders, each extender removably mounted between one of the transverse positioners and the base plate, and each extender having a first spacer portion extending the distance between the transverse positioners to accommodate a greater width of the larger carriers and a second spacer portion extending the distance between the transverse positioners and the first portion of the base to accommodate a greater length of the larger carriers.

10. A wafer transfer machine capable of transferring different size wafers between their respective transferor and receiver carriers, the machine comprising:

a. a base upon which wafer carriers are supported during transfer operations, the base having a first portion upon which transferor carriers are supported and a second portion upon which receiver carriers are supported;

b. a transfer arm operatively coupled to the base, the transfer arm moveable along a longitudinal axis at least over the first portion of the base;

c. a first axial positioner disposed on the first portion of the base for positioning a transferor carrier on the base;

d. a second axial positioner removably disposed on the second portion of the base for positioning a smaller receiver carrier on the base; and e. a third axial positioner disposed on the second portion of the base for positioning a larger receiver carrier on the base the third axial positioner disposed on the base farther from the transfer arm than is the second axial positioner and being formed when the second axial positioner is relocated on the base.

11. A wafer transfer machine according to claim 10, further comprising a pair of transverse positioners attached opposite one another on the base along a line perpendicular to the longitudinal axis, each transverse positioner having a first upstanding portion adjacent to the first portion of the base to engage a transferor carrier and a second upstanding portion adjacent to the second portion of the base to engage a receiver carrier.

12. A wafer transfer machine according to claim 11, wherein each transverse positioner is moveable between a first position for positioning smaller carriers and a second position for positioning larger carriers.

13. A wafer transfer machine according to claim 12, further comprising a pair of L shaped extenders, each extender removably mounted between one of the transverse positioners and the base plate, and each extender having a first spacer portion extending the distance between the transverse positioners to accommodate a greater width of the larger carriers and a second spacer portion extending the distance between the transverse positioners and the first portion of the base to accommodate a greater length of the larger carriers.

14. A wafer transfer machine capable of transferring different size wafers between their respective transfer or receiver carriers, the machine comprising:
   a. a base upon which wafer carriers are supported during transfer operations, the base having a first portion upon which transferor carriers are supported and a second portion upon which receiver carriers are supported;
   b. a transfer arm operatively coupled to the base, the transfer arm moveable along at least the first portion of the base;
   c. a first axial positioner disposed on the first portion of the base for positioning a transferor wafer carrier on the base;
   d. a second axial positioner disposed on the second portion of the base for positioning a receiver carrier on the base, the second axial positioner moveable between a first position closer to the transfer arm for positioning a smaller receiver carrier and a second position farther from the transfer arm for positioning a larger receiver carrier; and
   e. a plurality of different sized transfer plates removably attached to the transfer arm, a first one the transfer plates defining a wafer contact surface for smaller diameter wafers and a second one the transfer plates defining a wafer contact surface for larger diameter wafers.

15. A wafer transfer machine capable of transferring different sized wafers between their respective transferor and receiver carriers, the machine comprising:
   a. a base upon which wafer carriers are supported during transfer operations, the base having a first portion upon which transferor carriers are supported and a second portion upon which receiver carriers are supported;
   b. a transfer arm operatively coupled to the base, the transfer arm moveable along at least the first portion of the base;
   c. a first axial positioner disposed on the first portion of the base for positioning a transferor carrier on the base;
   d. a second axial positioner removably disposed on the second portion of the base for positioning a smaller receiver carrier on the base;
   e. a third axial positioner disposed on the second portion of the base for positioning a larger receiver carrier on the base, the third axial carrier disposed on the base farther from the transfer arm than is the second axial positioner and being formed when the second axial positioner is relocated on the base;
   f. a plurality of different sized transfer plates removably attached to the transfer arm, a first one of the transfer plates defining a wafer contact surface for smaller diameter wafers and a second one the transfer plates defining a wafer contact surface for larger diameter wafers.

* * * * *